(12) United States Patent
Fu et al.

(10) Patent No.: US 7,202,550 B2
(45) Date of Patent: Apr. 10, 2007

(54) INTEGRATED STRESS RELIEF PATTERN AND REGISTRATION STRUCTURE

(75) Inventors: Chung-min Fu, Chungli (TW);
Huang-Sheng Lin, Hsin-Chu (TW);
Yu-Chyi Harn, Bao-Shan (TW);
Hsien-Wei Chen, Sinying (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/983,425

(22) Filed: Nov. 8, 2004

(65) Prior Publication Data

US 2005/0263855 A1    Dec. 1, 2005

Related U.S. Application Data

(60) Provisional application No. 60/584,918, filed on Jul. 1, 2004, provisional application No. 60/575,853, filed on Jun. 1, 2004.

(51) Int. Cl.
*H01L 23/544* (2006.01)
*H01L 23/48* (2006.01)
*H01L 23/52* (2006.01)
*H01L 29/40* (2006.01)

(52) U.S. Cl. ..................... 257/620; 257/758

(58) Field of Classification Search ............. 257/620, 257/758–776
See application file for complete search history.

(56) References Cited

U.S. PATENT DOCUMENTS

| 4,642,672 | A  | * | 2/1987 | Kitakata ............. 257/797 |
| 6,614,120 | B2 | * | 9/2003 | Sato et al. .......... 257/758 |
| 2004/0002198 | A1 | * | 1/2004 | Lee et al. .......... 438/460 |
| 2004/0084777 | A1 | * | 5/2004 | Yamanoue et al. ..... 257/758 |

* cited by examiner

*Primary Examiner*—Cuong Nguyen
(74) *Attorney, Agent, or Firm*—Haynes and Boone, LLP

(57) ABSTRACT

A semiconductor die having an integrated circuit region formed in a substrate comprises at least one die-corner-circuit-forbidden (DCCF) region disposed in the substrate, proximate to the integrated circuit region; and at least one registration feature formed within the at least one DCCF region. The at least one registration feature comprises a structure selected from the group consisting of a laser fuse mark, an alignment mark, and a monitor mark.

31 Claims, 7 Drawing Sheets

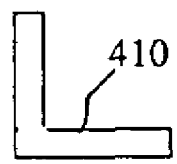
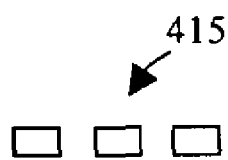
FIG. 4a  FIG. 4b  FIG. 4c  FIG. 4d
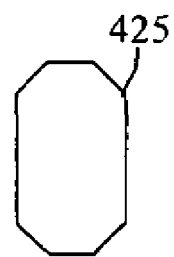
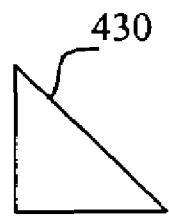
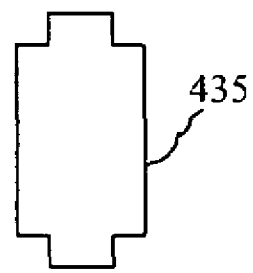
FIG. 4e  FIG. 4f  FIG. 4g

INTEGRATED STRESS RELIEF PATTERN AND REGISTRATION STRUCTURE

CROSS-REFERENCE

This application claims benefit and priority from U.S. Provisional Patent Application Ser. No. 60/575,853, filed on Jun. 1, 2004 and entitled "Integrated Stress Relief Pattern and Registration Structure" and from U.S. Provisional Patent Application Ser. No. 60/584,918, filed Jul. 1, 2004 and entitled "Integrated Stress Relief Pattern and Registration Structure."

BACKGROUND

In integrated circuit (IC) technologies, a chip stress relief pattern may be designed and fabricated on a chip to prevent cracking of the chip induced by stress from integrated circuit back-end processing such as die-sawing, packing, and plastic modeling. Typically, the chip stress relief pattern is formed in the corner of the chip where localized stress may be the greatest. Additionally, registration features such as laser fuse marks and other marks may also be formed on the chip used for alignment and monitor by a tool such as a laser-fuse tester during the chip probing stage. These two features are typically designed separately and laid out in separate locations on the chip. Therefore, the surface area of the chip available for circuit layout is reduced and limited by the chip stress relief and registration features.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4a to 4g are plan views of various embodiments of a registration feature.

DETAILED DESCRIPTION

Figure 1:
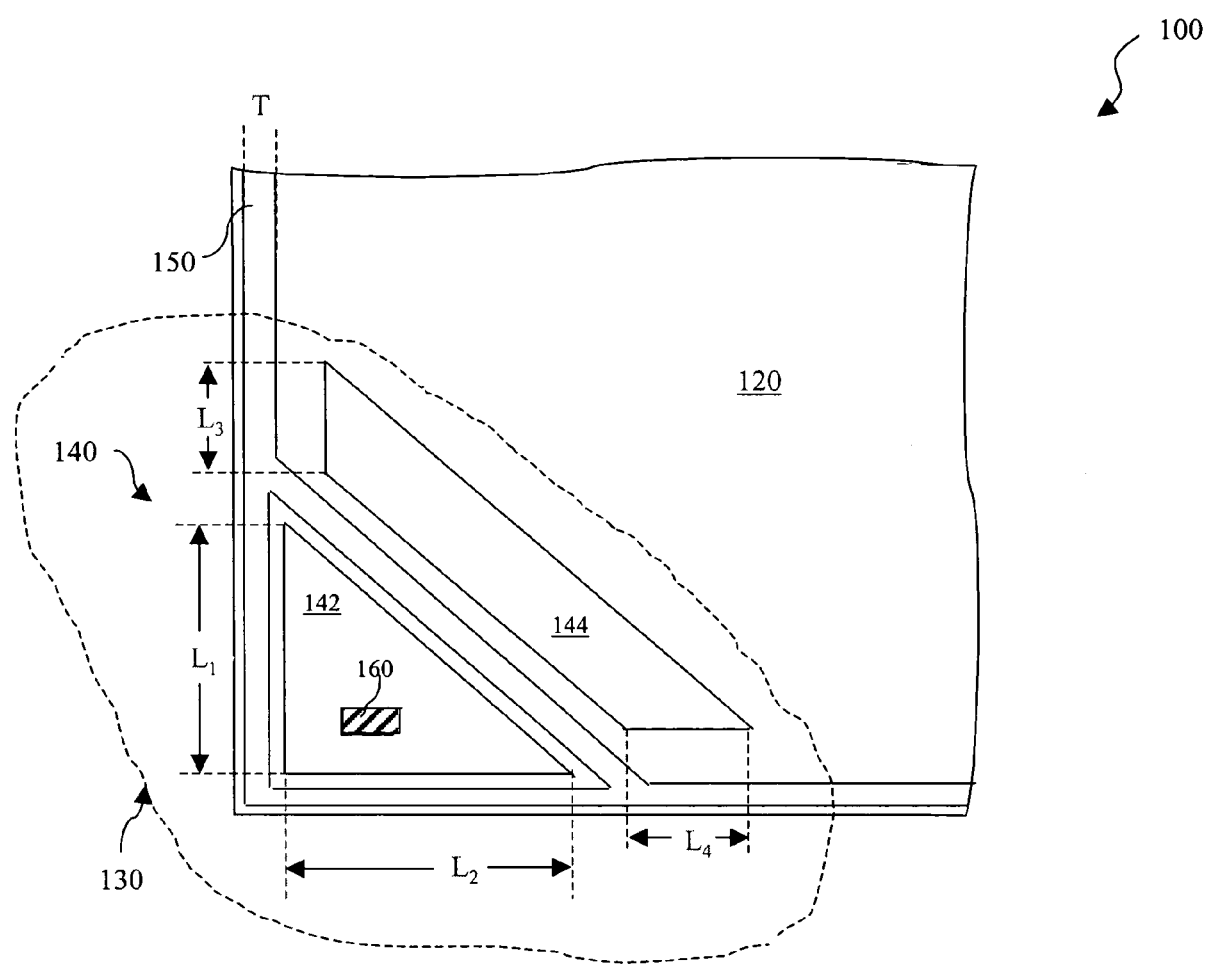
FIG. 1 is a plan view of one embodiment of an exemplary integrated circuit.

The present disclosure relates generally to microelectronic devices and, more specifically, to an integrated stress relief pattern and registration feature in an integrated circuit.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
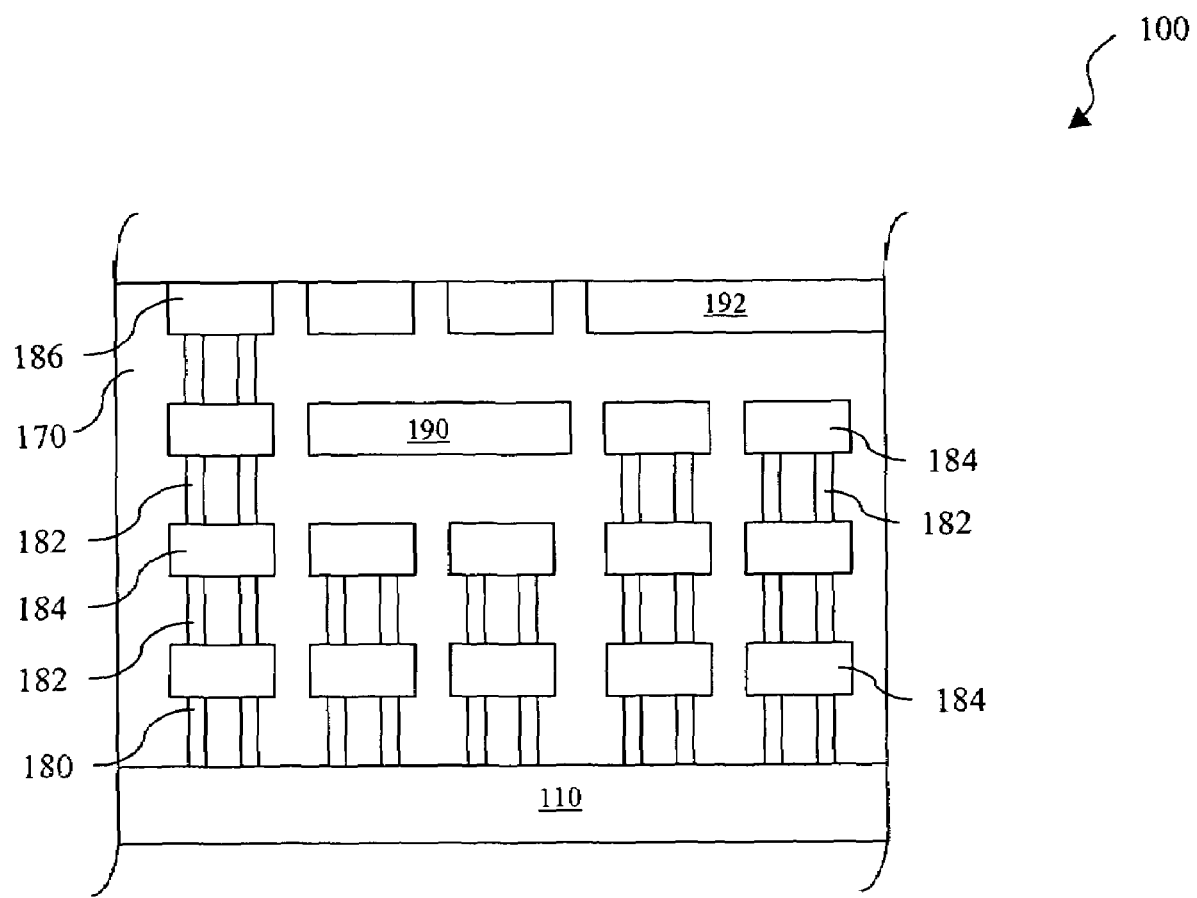
FIG. 2 is a sectional view of another embodiment of an exemplary integrated circuit.
Figure 3A:
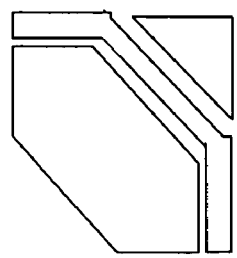
FIGS. 3a to 3i are plan views of various embodiment of a die-corner-circuit-forbidden region.
Figure 3B:
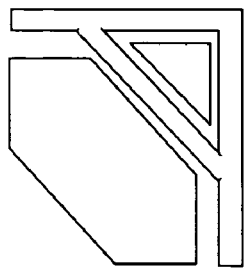
Figure 3C:
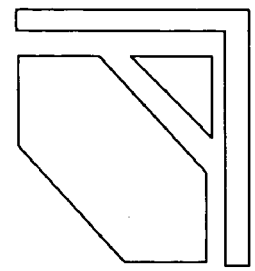
Figure 3D:
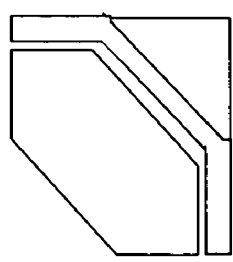
Figure 3E:
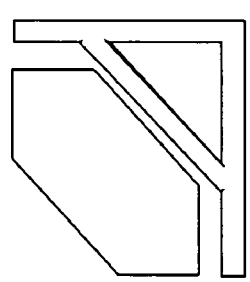
Figure 3F:
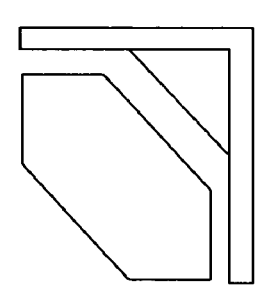
Figure 3G:
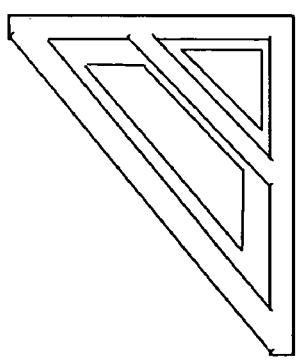
Figure 3H:
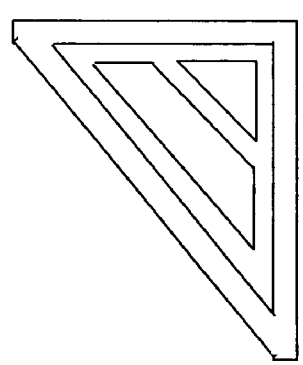
Figure 3I:
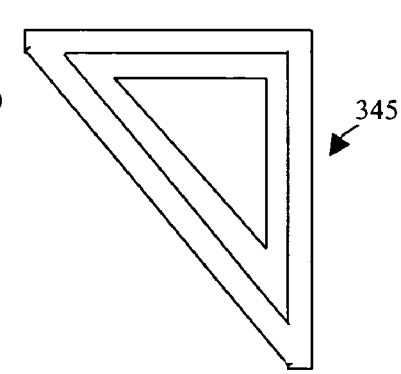

FIG. 1 is a plan view of one embodiment of a semiconductor die 100 having a combined chip corner structure. FIG. 2 is a sectional view of a portion of the semiconductor die 100. The semiconductor die 100 may comprise an integrated circuit region 120 formed in a substrate 110 consisting silicon, germanium, diamond, other semiconductor materials, dielectric thin film, or combinations thereof. The semiconductor die 100 may comprise an integrated circuit region 120 formed in the substrate 110. The integrated circuit region 120 may comprise a variety of electric devices, such as passive devices and active devices, formed in the substrate 110.

The semiconductor die 100 further includes a die-corner-circuit-forbidden (DCCF) region 130 formed onto the substrate 110. The DCCF region 130 is located in the corners of the semiconductor die 100. The integrated circuit is excluded from the DCCF region 130 because it is a region that may experience greater stress during and after backend processing such as die sawing and packaging. The DCCF region 130 may include a dummy metal pattern 140 for chip corner stress relief. The dummy metal pattern 140 may comprise a first corner stress relief (CSR) zone 142 and may further include a second CSR zone 144. The first and second CSR zones (142 and 144) may be positioned within the DCCF region 130 to be proximate to each other and configured such that the first CSR zone 142 is closest to the outline of DCCF region 130 and the second CSR zone 144 is closest to the integrated circuit region 120, as illustrated in FIG. 1. An exemplary shape of the first CSR zone 142 may be designed to substantially occupy in a triangular area, preferably a right triangle, in the DCCF region 130. An exemplary shape of the second CSR zone 144 may be designed to substantially occupy in a parallelepiped area or a trapezoid area, in the DCCF region 130. An exemplary size of the first CSR zone 142 may have outlines $L_1$ and $L_2$ ranging from about 50 micron to about 150 micron. An exemplary size of the second CSR zone 144 may have outlines $L_3$ and $L_4$ ranging from about 50 micron to about 200 micron. The DCCF region 130 may further include a portion of a seal ring 150.

In previous designs, the registration feature and DCCF area are designed separately and positioned at different location of a chip. Therefore, circuit layout and arrangement are impacted by the resultant available chip surface area and maximum chip area utilization is limited. In the structures described above, the corner stress relief pattern and registration feature are combined and co-located to maximize chip real estate available for circuit layout. FIGS. 3a to 3i are plan views of various exemplary embodiments illustrating configurations of the first CSR zone 142, the second CSR zone 144, and the seal ring 150 in the DCCF region 130.

A registration feature 160 may be formed within the DCCF region. Such a combined structure having the registration feature 160 co-located with the first CSR zone 142, the second CSR zone 144, and/or the seal ring 150 can use chip area more efficiently and save more chip area for the integrated circuit layout. The registration feature 160 may include a laser fuse mark such as a commonly used L-shaped mark (L-mark). The laser fuse mark may implement a structure having a reverse tone composition in which the laser fuse mark comprises a first material and the surrounding region comprises a second material, which is different from the first material such that the laser fuse mark has a high contrast for registration identification. For example, the laser fuse mark may comprise a dielectric material while the surrounding region comprises a metal material. The dielectric material to form the laser fuse mark may include silicon oxide, silicon nitride, silicon oxynitride, spin-on glass (SOG), low-k material, or combinations thereof. The laser fuse mark may be disposed within the top metal layer 186 and, alternatively, may be further extended to the substrate 110.

The registration feature 160 may include an alignment mark such as a photo alignment mark, a scanning electron microscope (SEM) mark, and other alignment mark. The alignment mark may provide a feature for alignment during photolithography processing, test, inspection, or measurement. The registration feature 160 may also include a monitor mark such as a critical dimension (CD) mark, a doping monitor pad, a chemical mechanical planarization (CMP) monitor pad, and an etching monitor pad. The monitor mark may provide a reference feature for process monitor and process control. Referring to FIG. 2, the dummy metal pattern 140 may comprise a plurality of patterned layers and a plurality of vertical columns coupled between the plurality of patterned layers. The dummy metal pattern 140 may be similar to multilayer interconnects formed in the integrated circuit region 120 in composition and formation. In one embodiment, the plurality of patterned layers includes a top metal layer 186 and other metal layers 184. The vertical columns include contacts 180 to interconnect between the substrate 110 and the first metal layer of the plurality of metal layers and vias 182 to interconnect between two metal layers. The dummy metal pattern 140 in the DCCF region 130 may be fabricated simultaneously with the multilayer interconnects in the integrated circuit region 120 using a method such as dual damascene processing. In one embodiment the dummy metal pattern 140 may include copper, copper alloy, titanium, titanium nitride, tantalum, tantalum nitride, tungsten, polysilicon, metal silicide, or combinations thereof. The dummy metal pattern 140 may be formed using a dual damascene process.

The shape of the registration feature preferably has easily identifiable linear edges and orientation. For example, a circle-shaped registration marker may not work well for most applications. The registration feature 160 may be designed to include a rectangular (405), an L-shaped (410), a series of rectangular features (415), a T-shaped (420), an octagon-shaped (425), a right triangle-shaped (430), and a cross shaped (435) as shown in FIGS. 4a–4g, respectively. Other suitable shapes may also be used.

The registration feature 160 may be disposed within the first CSR zone, as illustrated in FIG. 1, within the second CSR zone, within the seal ring, or combinations thereof. The laser fuse mark may be constructed having a reverse tone and disposed to vertically extend from the top metal layer of the dummy metal pattern to the substrate 110. The laser fuse mark may be disposed only within the top layer of the metal pattern. The alignment mark or the monitor mark may be vertically disposed within one or a plurality of metal layers of the dummy metal pattern while horizontally disposed within the first CSR zone, the second CSR zone, or within the seal ring.

In one embodiment, the laser fuse mark formed within the first CSR zone, having a reverse tone, will be further described later with reference to FIGS. 5 to 7. In another embodiment, the alignment mark or the monitor mark may be disposed within the first CSR zone, within the second CSR zone, or within the seal ring in the DCCF region. Furthermore, the alignment mark may be disposed within one of the first and second CSR zones and the seal ring while the monitor mark is disposed within another region thereof. In another embodiment, the laser fuse mark is disposed within the first CSR zone while the alignment mark or the monitor mark is also disposed within the first CSR zone, in which the alignment mark or the monitor mark may be formed within one metal layer without conflicting with the laser fuse mark, by separating two features horizontally in different areas and/or vertically in different layers. In another embodiment, the laser fuse mark having a reverse tone is disposed within the first CSR zone 132 while the alignment mark or the monitor mark is disposed within the second CSR zone 134 or the seal ring 150, in which the alignment mark or the monitor mark may be disposed vertically within a proper layer of the metal pattern.

FIG. 2 also exhibits a sectional view of exemplary monitor pads such as CMP monitor pads formed in the DCCF region. One CMP monitor pad 190 may be disposed within the top metal layer 186 and another CMP monitor pad 192 may be disposed within one of the plurality of metal layers 184. The CMP monitor pads 190 and 192 are substantially similar to the metal features 186 and 184 in composition and formation. Each of the CMP monitor pads may be designed to have a thickness substantially similar to the thickness of a metal feature for interconnects within the same metal layer. Each of the CMP monitor pads may be formed to have a predefined shape and dimension. For example, the CMP monitor pads may be designed as a rectangle 405 illustrated in FIG. 4a. The CMP monitor pads may be used for CMP processing monitoring and control such as monitoring of the polishing uniformity of the associated metal layer by in-situ or ex-situ measurement. The CMP monitor pads may be disposed horizontally in different location of a semiconductor wafer, including wafer center and wafer edge, and may be designed within the DCCF 130 of the relevant die to save more chip area for the integrated circuit 120. The CMP monitor pads 190 and 192 may be disposed within the first CSR zone 142, the second CSR zone 144, or one of them is within the first CSR zone 142 and the another is within the second CSR zone 144. The CMP monitor pads described here are only serving as examples without limiting.

Figure 5:
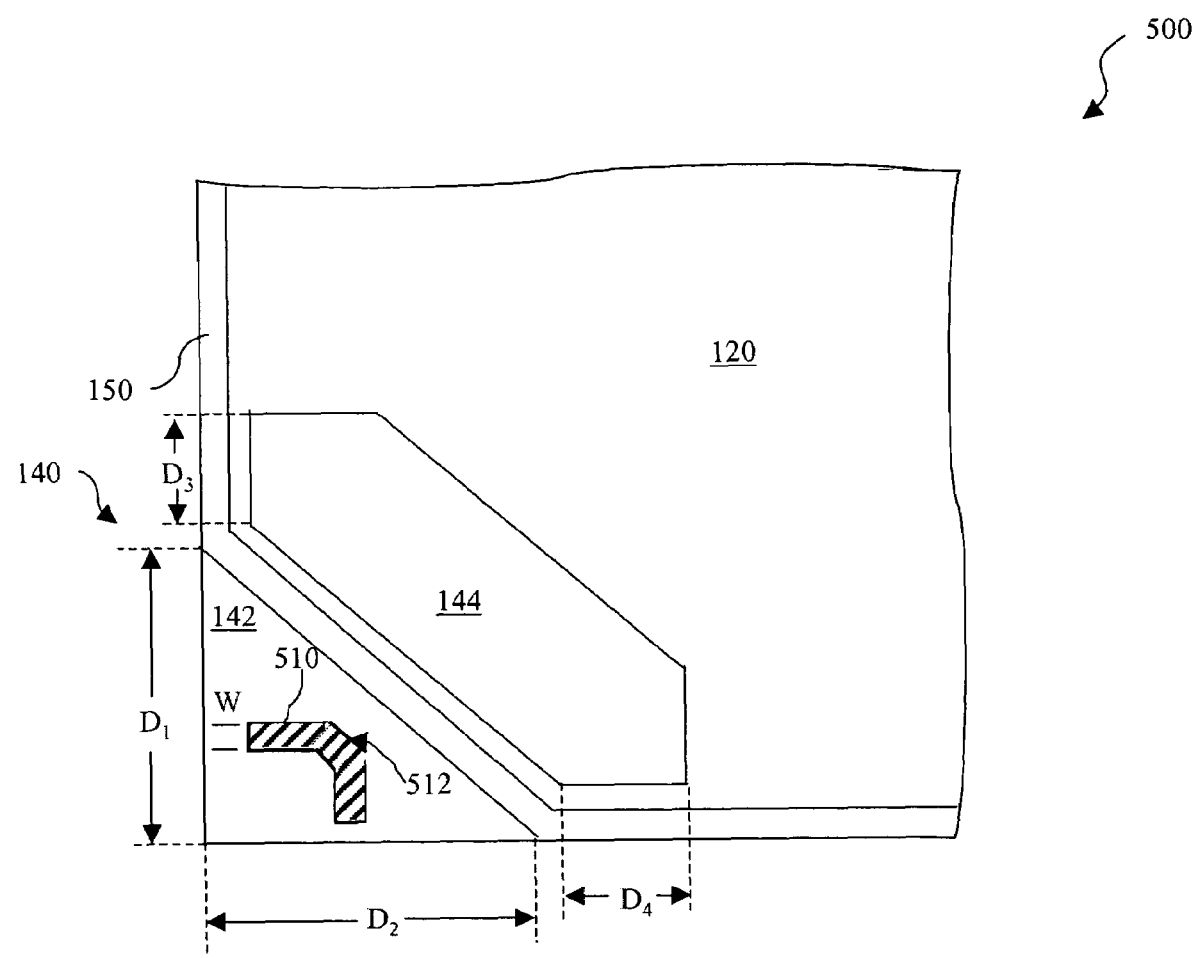
FIG. 5 is a plan view of one embodiment of an exemplary integrated circuit.

FIG. 5 exhibits a plan view of another embodiment of a corner portion of a semiconductor die 500 having a structure combined a stress relief pattern 140 and a registration feature 510 such as a laser fuse mark. FIG. 6 is a sectional view of the same. The semiconductor die 500 comprises an integrated circuit region 120 formed in a substrate 110. The integrated circuit region 120 may further include a variety of microelectronic devices formed in the substrate 110.

The integrated circuit chip 500 may further include a stress relief pattern 140 formed onto the substrate 110. The stress relief pattern 140 may be positioned in the corners of the chip because it is a region that may experience greater stress during backend processing such as die sawing and packaging. An exemplary shape of the stress relief pattern 140 may be designed to include a stress relief feature 142 substantially occupy in a right triangular area in the corner of the chip. The stress relief feature 142 may have a surface dimension of $D_1$ along a first axis and $D_2$ along a second axis. The dimensions $D_1$ and $D_2$ may each range from about 50 microns to about 150 microns. For example, the stress relief feature 142 may be a right triangular pattern with the dimensions $D_1$ and $D_2$ at about 75 microns.

Figure 6:
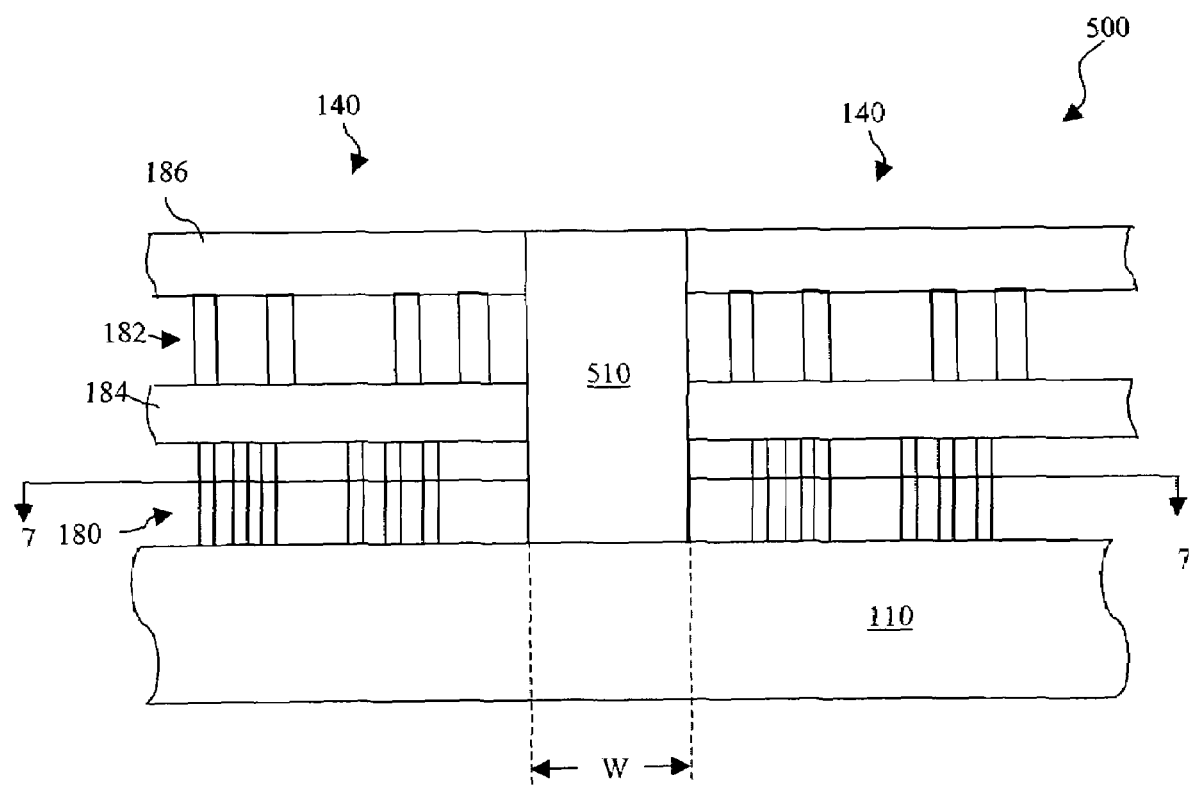
FIG. 6 is a sectional view of one embodiment of an exemplary integrated circuit
Figure 7:
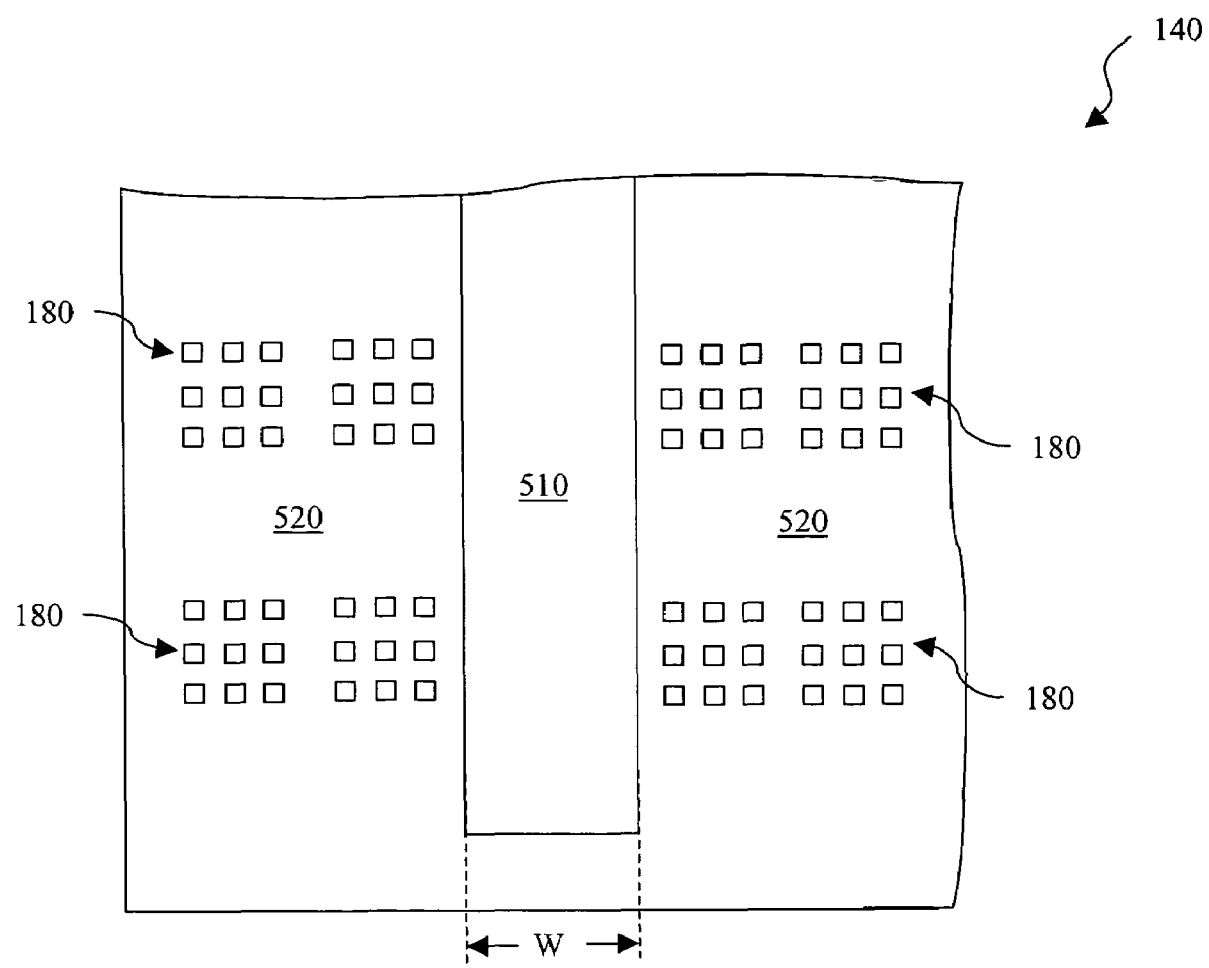
FIG. 7 is a sectional view of one embodiment of the integrated circuit of FIG. 6 sectioned at a via/contact structure.

Referring to the sectional view in FIG. 6, the stress relief pattern 140 may also extend vertically to one or more patterned metal layers 184 and 186. In particular, the stress relief pattern 140 may include a surface patterned metal layer 186 and one or more intermediate patterned metal layers 184 interconnected by one or more metal contacts 180 and metal vias 182. Referring to FIG. 7, a plan view across the metal contacts 180 is shown. The metal contacts 180 may form a regular array pattern such as the example shown in FIG. 3, and an interlayer dielectric (ILD) 520 or another suitable material may be used around the metal contacts 180. It should be understood that other suitable configurations and arrangements of the metal contacts 180 in the stress relief pattern 140 may be used.

Patterned metal layer 186 may have a mesh or grid configuration with a plurality of regularly patterned and spaced regions. Interlayer dielectric or another suitable material may be used to fill in the spaced regions in the grid pattern. Other suitable configurations and arrangements of the metal layer 186 may be used. The patterned metal layer 184 may have the same or different metal grid pattern. The stress relief pattern 140, including all of its components shown in FIGS. 5–7, may generally comprise conductive materials similar to those of multilayer interconnects.

The process to form the stress relief pattern 140 may be substantially similar to the process to form the multilayer interconnects. Further, the stress relief pattern 140 may be formed along with the multilayer interconnects in the chip in a single processing flow so that no additional processing step is needed. As an exemplary method for copper technologies, the stress relief pattern 140 may be formed along with the multilayer interconnects by a dual damascene process.

Referring again to FIG. 5, the integrated circuit chip 500 may further include a registration feature 510 formed within the stress relief pattern 140. The registration feature 510 has a reverse tone with the stress relief pattern 140, integrated, and co-located therewith, in this example, in the corner of the chip. The registration feature 510 may be used for registration and alignment purposes by a fuse-laser tester or other equipment during inline monitoring and/or backend processing. For example, L-shaped marks may be used by the fuse-laser equipment during the chip probing manufacturing stage for alignment and registration. The registration feature 510 may comprise a dielectric material formed in a certain shape that extends down to the substrate 110 (FIG. 6). The registration feature 510 may include silicon oxide, silicon nitride, polyimide, spin-on glass (SOG), fluoride-doped silicate glass (FSG), a low k material, and/or a combination thereof. The registration feature 510 may be formed along with the stress relief pattern 140 in the same process flow to form the multilayer interconnects in the chip so that no additional processing steps are needed.

The registration feature 510 may be generally L-shaped in one embodiment, as shown in FIG. 5. The L-shaped registration feature may have a flat edge (also referred to as bending knee) 512 at its corner closest to the integrated circuit 120 and its seal ring 150.

The stress relief feature 142 may only located outside the enclosure of the seal ring 150. The registration feature 510 may be co-located outside the enclosure of the seal ring. Alternatively, the stress relief pattern 140 may be designed to include a stress relief feature 144 to substantially occupy an area in the corner of the chip and is inside the enclosure of the seal ring 150 as shown in FIG. 5. The stress relief feature 144 may be designed to substantially occupy a parallelogram area or a trapezoid area proximate to the seal ring 150. The stress relief pattern 140 may also be designed to include both a feature outside the seal ring, such as the stress relief feature 142, and a feature inside the seal ring, such as the stress relief feature 144. The registration feature 510 may be formed in the stress relief feature 142 and co-located inside the enclosure of the seal ring. The stress relief pattern 140 may be positioned inside the seal ring 150 and may have a gap between them about 10 microns or more. The stress relief feature 144 may have a surface dimension $D_3$ along the first axis and $D_4$ along the second axis. The dimensions $D_3$ and $D_4$ may each range from about 50 microns to about 200 microns. For example, the stress relief feature 144 may be a right parallelogram pattern with the dimensions $D_3$ and $D_4$ at about 85 microns.

The bending knee edge enables the registration feature 510 to be positioned closer to the circuit 510 because a certain minimum distance therebetween may be required. The registration feature 510 may be formed to have a width and predetermined distances from other features on the chip 500 for good laser detection and stress immunity. Other predetermined spacing may be designed and implemented for the registration feature 530. The width, W, of the registration feature 510 may be about 10 microns or be of a width suitable for recognition and alignment. In addition to the L-shaped registration feature 510 with a bending knee, other suitable shapes may be used, including shapes shown in FIGS. 4a–4g, respectively.

In the integrated stress relief pattern and registration feature described above, the two structures are combined and co-located to maximize chip real estate available for circuit layout. In particular, the registration feature has a reverse tone with the stress relief pattern and is placed within the area allocated for the stress relief pattern, such as in the corners of the chip. Such integrated structure of stress relief pattern and registration feature having a reverse tone may be used in different technologies such as fused device in which an L mark is needed for fuse-laser operation including laser trimming.

In general, a registration feature may be integrated and co-located with a die-corner-circuit-forbidden region formed in a substrate. The substrate may be an elementary semiconductor such as silicon, germanium, and diamond. The substrate may also comprise a compound semiconductor such as silicon carbide, gallium arsenic, indium arsenide, and indium phosphide. The substrate may comprise an alloy semiconductor such as silicon germanium, silicon germanium carbide, gallium arsenic phosphide, and gallium indium phosphide. Furthermore, the substrate may comprise an epitaxial layer, raised source/drain, semiconductor-on-insulator (SOI) structure, or combination.

The integrated circuit formed in the substrate may include, but are not limited to, passive components such as resistors, capacitors, and inductors; and active components such as metal-oxide-semiconductor field effect transistors (MOSFETs), bipolar transistors, high power transistors, high frequency transistors, memory cells, devices having fuse features, or combinations thereof.

The structure integrated a registration feature within a die-corner-circuit-forbidden region may have a multilayer metal structure having stacked contact/via and metal layers. Processing to form the above integrated structure may be compatible to a process to form a multilayer interconnect and may further be formed in a single process flow. For example, the integrated structure may be formed by a dual damascene process for copper interconnects. The metal connects are formed on the semiconductor substrate in a boundary defined for the stress relief feature while preserving a space of a predetermined shape and dimensions for the registration feature. The voids are filled with a dielectric material, including the reserved space for the registration feature. A metal layer is formed and patterned within the stress relief feature boundary but avoiding the registration feature space, and voids therein are filled with a dielectric material. Subsequent metal connects and patterned metal layers are formed with a dielectric material filling the voids. The process may include chemical vapor deposition (CVD), physical vapor deposition (PVD), spin-on, and plating for metal and dielectric deposition. The process may further include photolithography, etching, and chemical mechanical polishing for patterning and planarization. The stress relief pattern may comprise copper, copper alloy, titanium, titanium nitride, tungsten, polysilicon, metal silicide, or combinations of metals. Alternatively, the registration feature may comprise a metal material and be formed with other metal features including the stress relief pattern, the seal ring, and the multilayer interconnects.

In another embodiment, the processing and materials used to form the integrated stress relief pattern and registration feature may also be compatible to those of aluminum technologies for multilayer interconnects. The stress relief pattern may comprise aluminum, aluminum/silicon/copper alloy, titanium, titanium nitride, tungsten, polysilicon, metal silicide, or combinations as used in 0.18 µm or larger technology nodes. Aluminum may be deposited by sputtering, chemical vapor deposition (CVD), or combinations thereof. Other manufacturing processes, including photolithography and etching, may be used to pattern metal materials for vertical features (via and contact) and horizontal connects (metal layers).

Dielectric materials used to form the registration feature and fill in the spaces in the stress relief pattern may include but not limit to silicon oxide, silicon nitride, silicon oxynitride, spin-on glass, and/or low-k material. The low-k material may include fluoride-doped silicate glass (FSG), polyimide, Black Diamond® (a product of Applied Materials of Santa Clara, Calif.), Xerogel, Aerogel, amorphous fluorinated carbon, Parylene, BCB, Flare, and SiLK, and/or other materials. The dielectric material may be formed by CVD, atomic layer deposition (ALD), physical vapor deposition (PVD), spin-on coating and/or other processes.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A semiconductor die having an integrated circuit region formed on a substrate comprising:
    at least one die-corner-circuit-forbidden (DCCF) region disposed on the substrate and proximate to the integrated circuit region, wherein the DCCF region includes a dummy metal pattern; and
    at least one registration feature formed within the at least one DCCF region, wherein the at least one registration feature comprises a structure selected from the group consisting of a laser fuse mark, an alignment mark, and a monitor mark.

2. The semiconductor die of claim 1 wherein the laser fuse mark comprises an L-mark.

3. The semiconductor die of claim 1 wherein the alignment mark is selected from the group consisting of a photo-alignment mark and a scanning electron microscope (SEM) mark.

4. The semiconductor die of claim 1 wherein the monitor mark is selected from the group consisting of a critical dimension (CD) mark, a chemical mechanical planarization (CMP) monitor pad, a doping monitor pad, and an etch monitor pad.

5. The semiconductor die of claim 1 wherein the at least one registration feature comprises a dielectric material.

6. The semiconductor die of claim 1 wherein the at least one registration feature comprises a conductive material.

7. The semiconductor die of claim 1 wherein the DCCF region further comprises a portion of a seal ring.

8. The semiconductor die of claim 7 wherein the dummy metal pattern comprises a metal selected from the group consisting of copper, copper alloy, aluminum, aluminum alloy, tantalum, tantalum nitride, titanium, titanium nitride, tungsten, and metal silicide.

9. The semiconductor die of claim 7 wherein the dummy metal pattern comprises:
    a plurality of patterned layers; and
    a plurality of vertical columns coupled between the plurality of patterned layers.

10. The semiconductor die of claim 9 wherein the at least one registration feature is formed in at least one of the plurality of patterned layers.

11. The semiconductor die of claim 9 wherein the at least one registration feature comprises:
    a first structure of the at least one registration feature formed in one of the plurality of patterned layers with a first predefined shape and a first set of dimensions; and
    a second structure of the at least one registration feature formed in one of the plurality of patterned layers with a second predefined shape and a second set of dimensions.

12. The semiconductor die of claim 9 wherein the at least one registration feature is disposed within the top metal layer of the plurality of patterned layers.

13. The semiconductor die of claim 12 wherein the at least one registration feature is extended down to the substrate through all layers of the plurality of patterned layers.

14. The semiconductor die of claim 1 wherein the dummy metal pattern comprises at least one of a first chip stress relief (CSR) zone and a second CSR zone.

15. The semiconductor die of claim 14 wherein the second CSR zone is horizontally disposed between the first CSR zone and the integrated circuit region.

16. The semiconductor die of claim 14 wherein the first CSR zone occupies a triangle area.

17. The semiconductor die of claim 14 wherein the portion of the seal ring is disposed positioned between the first and second CSR zones.

18. The semiconductor die of clam 14 wherein the at least one registration feature is disposed within the first CSR zone.

19. The semiconductor die of claim 14 wherein the at least one registration feature is disposed within the second CSR zone.

20. The semiconductor die of claim 14 wherein the at least one registration feature is disposed within the seal ring.

21. The semiconductor die of claim 14 wherein a first feature of the at least one registration feature is located within the first CSR zone and a second feature of the at least one registration feature is located within one of the first CSR zone, the second CSR zone, and the portion of the seal ring.

22. The semiconductor die of claim 14 wherein the at least one registration feature comprises a material having a reverse tone from the dummy metal pattern in composition.

23. The semiconductor die of claim 14 wherein the seal ring is designed as a vertical wall extended into the substrate, having a pre-designed thickness.

24. An integrated circuit comprising:
a stress relief feature formed on a substrate; and
a registration feature comprising an L-shaped marker having a reverse tone composition formed within the stress relief feature, wherein the L-shaped marker comprises a first material and the surrounding region comprises a second material which is different from the first material.

25. The integrated circuit of claim 24 wherein the stress relief feature is disposed in a corner of the semiconductor substrate.

26. The integrated circuit of claim 24 wherein the stress relief feature occupies a triangular area in a corner of the semiconductor substrate.

27. The integrated circuit of claim 24 wherein the stress relief feature comprises:
a plurality of patterned metal layers; and
a plurality of metal connects coupled between the plurality of patterned metal layers.

28. The integrated circuit of claim 27 wherein the plurality of vertical columns comprise an array of squares.

29. The integrated circuit of claim 24 wherein the registration feature comprises an L-shaped marker extending down to the semiconductor substrate and unoccupied by underlying structures of the stress relief feature.

30. The integrated circuit of claim 24 wherein the registration feature comprises a dielectric material selected from the group consisting of silicon oxide, silicon nitride, polyimide, spin-on glass (SOG), fluoride-doped silicate glass (FSG), and a low k material.

31. The integrated circuit of claim 24 wherein the stress relief feature comprises a conductive material selected from the group consisting of copper, copper alloy, aluminum, aluminum alloy, tantalum, tantalum nitride, titanium, titanium nitride, tungsten, and metal silicide.

* * * * *